United States Patent
Kruiskamp

(10) Patent No.: US 11,606,030 B1
(45) Date of Patent: Mar. 14, 2023

(54) DRIVER FOR DRIVING A P-TYPE POWER SWITCH

(71) Applicant: Dialog Semiconductor B.V., s-Hertogenbosch (NL)

(72) Inventor: Marinus Wilhelmus Kruiskamp, 's-Hertogenbosch (NL)

(73) Assignee: Dialog Semiconductor B.V., 's-Hertogenbosch (NL)

(*) Notice: Subject to any disclaimer, the term of this patent is extended or adjusted under 35 U.S.C. 154(b) by 145 days.

(21) Appl. No.: 17/071,792

(22) Filed: Oct. 15, 2020

(51) Int. Cl.
*H02M 1/08* (2006.01)
*H02M 3/158* (2006.01)
*H03K 17/687* (2006.01)

(52) U.S. Cl.
CPC ............. *H02M 3/158* (2013.01); *H02M 1/08* (2013.01); *H03K 17/6872* (2013.01)

(58) Field of Classification Search
CPC ..... H03K 17/6872; H02M 1/08; H02M 3/158
See application file for complete search history.

(56) References Cited

U.S. PATENT DOCUMENTS

| | | | |
|---|---|---|---|
| 5,633,600 A * | 5/1997 | Ohnishi | H03K 17/162 326/27 |
| 2004/0012411 A1 * | 1/2004 | Guedon | H03K 17/102 326/86 |
| 2007/0273350 A1 * | 11/2007 | Yamamoto | H02M 1/08 323/284 |
| 2012/0182049 A1 * | 7/2012 | Garbossa | H02M 3/155 327/109 |

FOREIGN PATENT DOCUMENTS

CN     104795976 A  *  7/2015 ............... H02M 1/08

OTHER PUBLICATIONS

"Design of On-Chip Gate Drivers With Power-Efficient High-Speed Level Shifting and Dynamic Timing Control for High-Voltage Synchronous Switching Power Converters," by Zhidong Liu et al., IEEE Journal of Solid-State Circuits, vol. 50, No. 6, Jun. 2015, pp. 1463-1477.

* cited by examiner

*Primary Examiner* — Kyle J Moody
*Assistant Examiner* — Jye-June Lee
(74) *Attorney, Agent, or Firm* — Saile Ackerman LLC; Stephen B. Ackerman

(57) ABSTRACT

There is presented a driver and a corresponding method for driving a p-type power switch. The driver includes a capacitor coupled to a control terminal of the power switch. The driver is configured to apply a control voltage to the control terminal and to connect the control terminal to ground to reduce the control voltage down to a target value to switch the power switch on. When identifying that the control voltage has reached the target value, the driver disconnects the control terminal from ground. The driver may be used in various circuits including switching power converters, audio amplifiers and charge-pump circuits.

18 Claims, 7 Drawing Sheets

DRIVER FOR DRIVING A P-TYPE POWER SWITCH

TECHNICAL FIELD

The present disclosure relates to a driver for driving a power switch. In particular, the disclosure relates to a driver for driving a p-type power switch.

BACKGROUND

Power switches are designed to carry relatively large currents and voltages. They may be implemented as power (Metal Oxide Silicon Field Effect Transistor) MOSFET or as power (Insulated Gate Bipolar Transistor) IGBT transistors. For example, a power FET transistor may be able to handle more than 1 Ampere of drain current. Various types of circuits such as switching power converters and audio amplifiers use power switches.

Switching power converters such as buck, boost or buck-boost converters may be implemented with a p-type power switch at the high side. The p-type power switch is often provided by a p-type metal-oxide-semiconductor pMOS power transistor. In some cases the maximum gate voltage of a pMOS high-side power transistor may be less than the input voltage of the converter. For instance thick-oxide transistors in 22 nm technology can only withstand 1.8 V, that is significantly less than the voltage of a Li-ion battery. The voltage of a typical Li-ion battery ranges from 2.5V when the battery is almost empty to 4.2V when the battery is full.

In this scenario, driving the gate of the high-side pMOS transistor requires careful consideration. Some buck converters are provided with a low-ohmic high-side-ground, which increase the cost of the chip. Alternatively, buck converters can be implemented with a buffer and feedback loop, however this approach increases the complexity of the system, increases the consumption of static power, and reduces the response time of the converter.

SUMMARY

It is an object of the disclosure to address one or more of the above-mentioned limitations. According to a first aspect of the disclosure, there is provided a driver for driving a p-type power switch, the driver comprising a capacitor coupled to a control terminal of the power switch; the driver being adapted to apply a control voltage to the control terminal, to connect the control terminal to ground to reduce the control voltage down to a target value to switch the power switch on; and to disconnect the control terminal from ground upon identifying that the control voltage has reached the target value.

Optionally, the control terminal is coupled to ground via a first switch and a second switch.

Optionally, the capacitor has a first terminal coupled to the control terminal and a second terminal coupled to a voltage source via a third switch, the voltage source being adapted to provide a predetermined voltage.

The first switch and the second switch may be of a same type, for instance the first and second switches may be n-type transistors such as nMOS transistors. The third switch may be a p-type transistor such as a pMOS transistor.

Optionally, the second terminal of the capacitor is coupled to a control terminal of the second switch.

The second switch may have a relatively low voltage threshold. For instance, the voltage threshold of the second switch may be close or equal to zero volts.

Optionally, the predetermined voltage is set to a limit value of the power switch.

The limit value may correspond to a maximum absolute amplitude value that can be sustained by the transistor without damaging it. For example, the limit value may be a maximum allowed voltage between the control terminal and another terminal adapted to receive an input voltage. For instance, the power switch may be a pMOS transistor and the limit value may be a maximum source-gate voltage that can be sustained by the transistor without damaging it.

Optionally, a voltage across the capacitor remains substantially constant.

Optionally, the driver comprises a fourth switch having a first terminal adapted to receive an input voltage, and a second terminal coupled to the control terminal of the power switch.

Optionally the target value is defined by a difference between the input voltage and the predetermined voltage.

Optionally, the driver is operable in a sequence of states comprising a first state to turn the power switch off and a second state to turn the power switch on, wherein in the first state the control voltage is set to the input voltage and wherein in the second state the control voltage is set to a value defined by a difference between the input voltage and the predetermined voltage.

Optionally, in the first state the first switch is off, the third switch is on and the fourth switch is on, and in the second state the first switch is on, the third switch is off and the fourth switch off.

Optionally, the driver comprises a controller adapted to generate a first logic signal configured to control the first switch and the third switch, and a second logic signal configured to control the fourth switch.

According to a second aspect of the disclosure there is provided a circuit comprising a p-type power switch coupled to a first driver, the first driver comprising a capacitor coupled to a control terminal of the power switch; the first driver being adapted to apply a control voltage to the control terminal, to connect the control terminal to ground to reduce the control voltage down to a target value to switch the power switch on; and to disconnect the control terminal from ground upon identifying that the control voltage has reached the target value.

For instance, the circuit may be a switching power converter such as a buck, a boost or a buck-boost converter. Alternatively, the circuit may be an audio amplifier such as a class-D audio amplifier. Alternatively, the circuit may be a charge-pump circuit.

Optionally, the control terminal is coupled to ground via a first switch and a second switch, the capacitor having a first terminal coupled to the control terminal and a second terminal coupled to a voltage source via a third switch.

Optionally, the circuit is a switching power converter.

Optionally, the switching power converter comprises a n-type power switch coupled to a second driver.

Optionally, the second driver is adapted to receive a signal from the second terminal of the capacitor.

Optionally, the second driver comprises two NOT gates coupled in series and wherein the second driver is adapted to enable or disable one of the NOT gates using the signal from the second terminal of the capacitor.

The circuit according to the second aspect of the disclosure may comprise any of the features described above in relation to the driver according to the first aspect of the disclosure.

According to a third aspect of the disclosure, there is provided a method for driving a p-type power switch, the method comprising providing a capacitor coupled to a control terminal of the power switch, applying a control voltage to the control terminal, connecting the control terminal to ground to reduce the control voltage down to a target value to switch the power switch on, and disconnecting the control terminal from ground upon identifying that the control voltage has reached the target value.

The options described with respect to the first aspect of the disclosure are also common to the third aspect of the disclosure.

BRIEF DESCRIPTION OF THE DRAWINGS

The disclosure is described in further detail below by way of example and with reference to the accompanying drawings, in which.

DESCRIPTION

Figure 1:
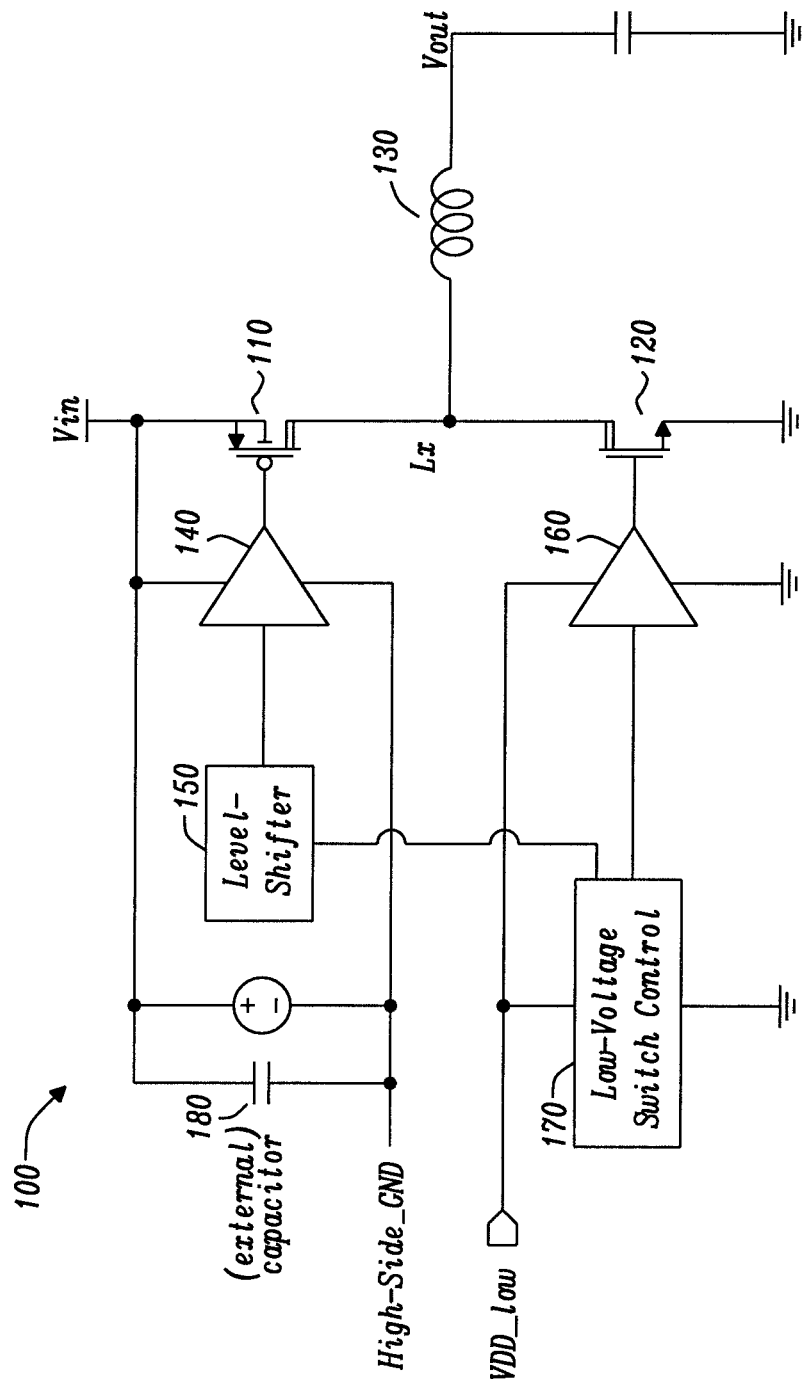
FIG. 1 is a buck converter provided with an external capacitor and high-side ground.

FIG. 1 shows a buck converter according to the prior art. The power converter 100 includes a high side power switch 110 coupled to a low side power switch 120 at a switching node Lx. The high side power switch 110 is coupled to a high side driver 140 and the low side power switch 120 is coupled to a low side driver 160. A low-voltage switch controller 170 is coupled to the high driver via level shifter 150, and the low side driver 160 directly. The high side driver 140 is coupled to an external capacitor having a first terminal connected to an input voltage source (Vin) and a second terminal connected to a high side ground terminal. The external capacitor 180 acts as a supply decoupling capacitor to keep the voltage constant, even in the event of short current pulses.

Figure 2:
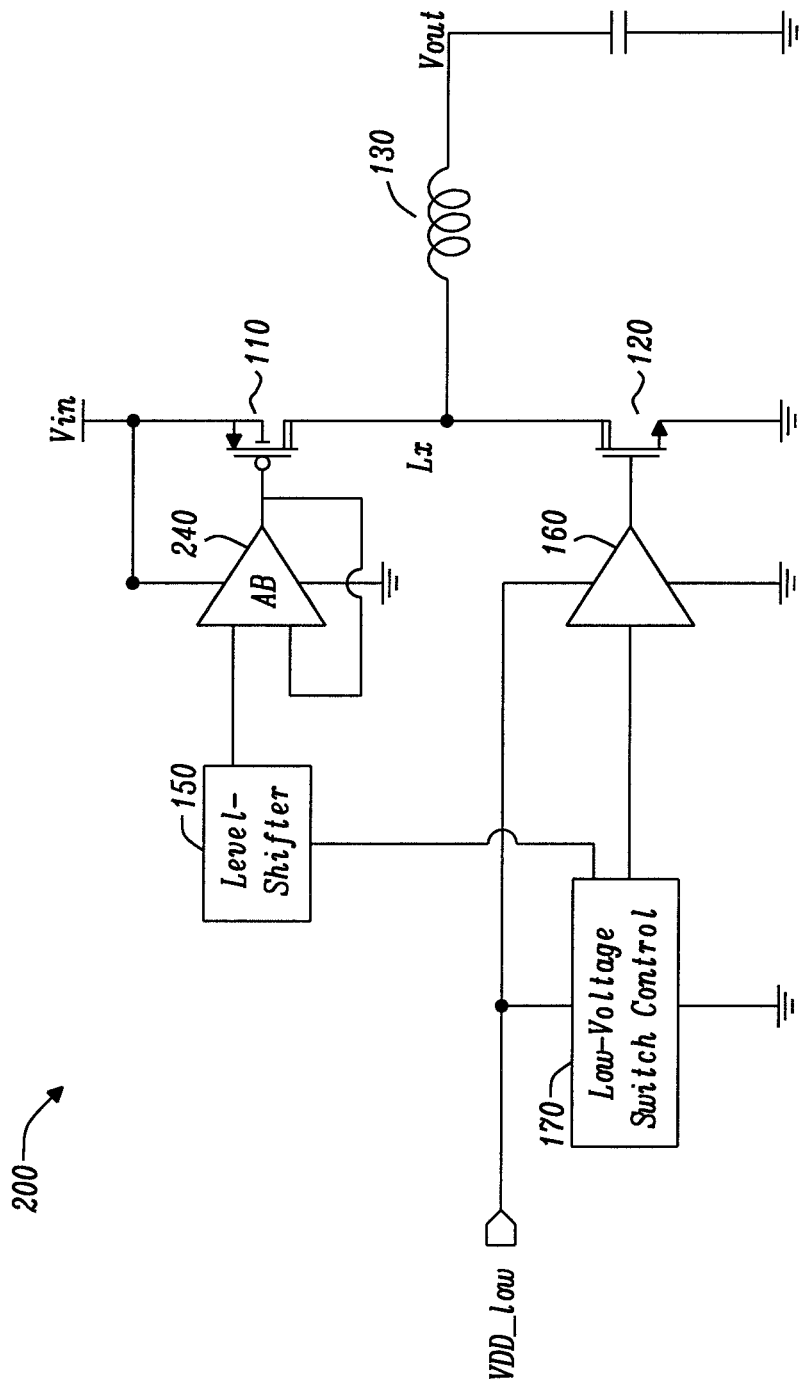
FIG. 2 is a buck converter provided with a class-AB gate driver.

FIG. 2 shows another buck converter. The circuit 200 of FIG. 2 shares many similar components to those illustrated in the circuit 100. The same reference numerals have been used to represent corresponding components and their description will not be repeated for sake of brevity.

In this circuit the high side driver 140 has been replaced by a class-AB gate driver 240 provided with a feedback loop between the gate terminal of the high side power switch 110 and the input of the driver 240. In this case no high-side ground is required, but the implementation of a feedback loop increases the complexity of the circuit.

Figure 3:
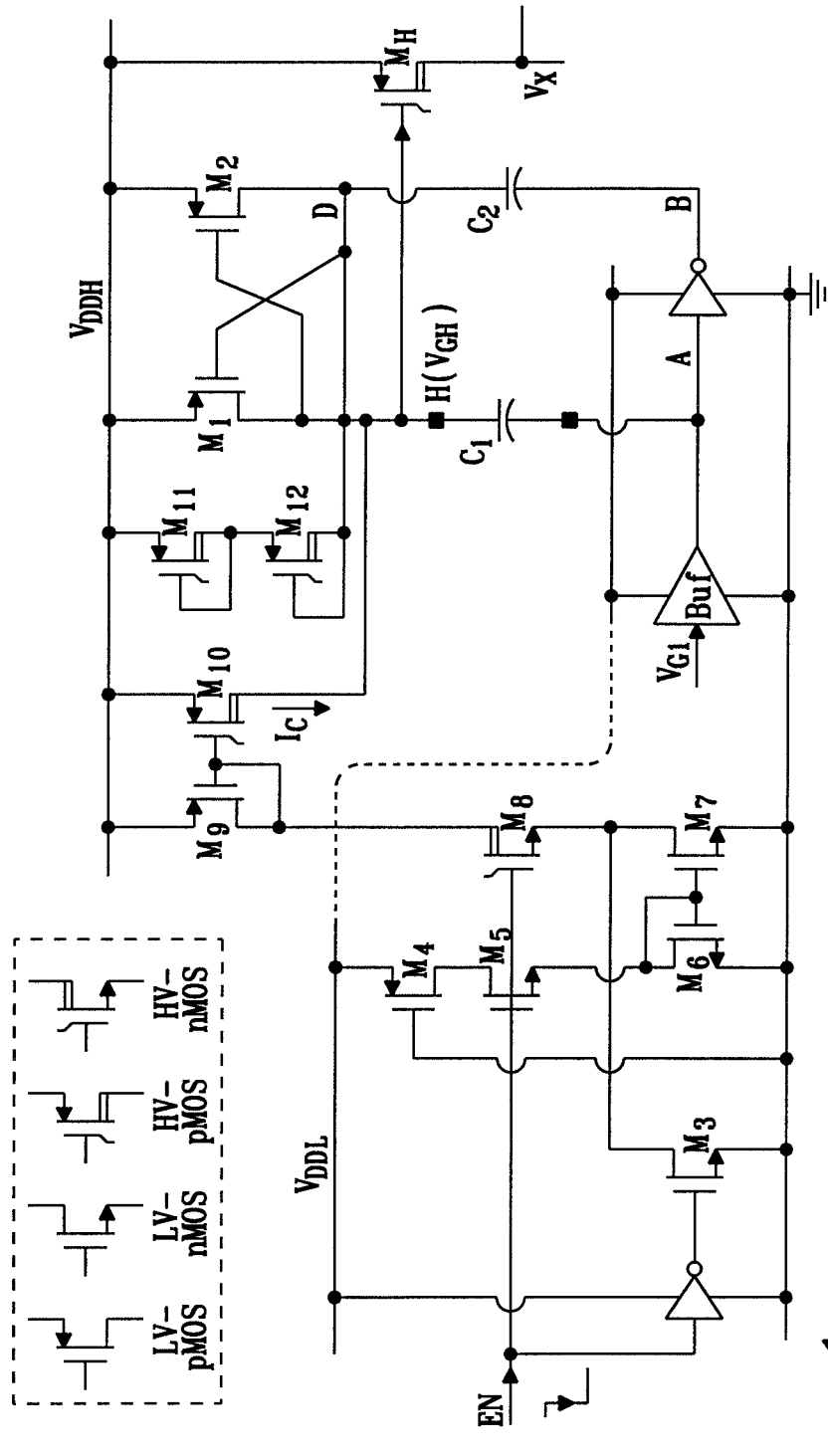
FIG. 3 is a high-side driver based on a capacitive level-shifter.

FIG. 3 shows a high-side driver as described in the publication by Z. Liu, L. Cong and H. Lee, titled "Design of On-Chip Gate Drivers With Power-Efficient High-Speed Level Shifting and Dynamic Timing Control for High-Voltage Synchronous Switching Power Converters," in IEEE Journal of Solid-State Circuits, vol. 50, no. 6, pp. 1463-1477, June 2015. In this circuit a capacitive level-shifter is used to drive the high-side pMOS switch directly. The drawback of this approach resides in the size of C1, which need to be significantly larger than the capacitance of transistor MH. It can be estimated that the required die-area of C1 could exceed the area needed for the low-side and high-side switches together.

Figure 4:
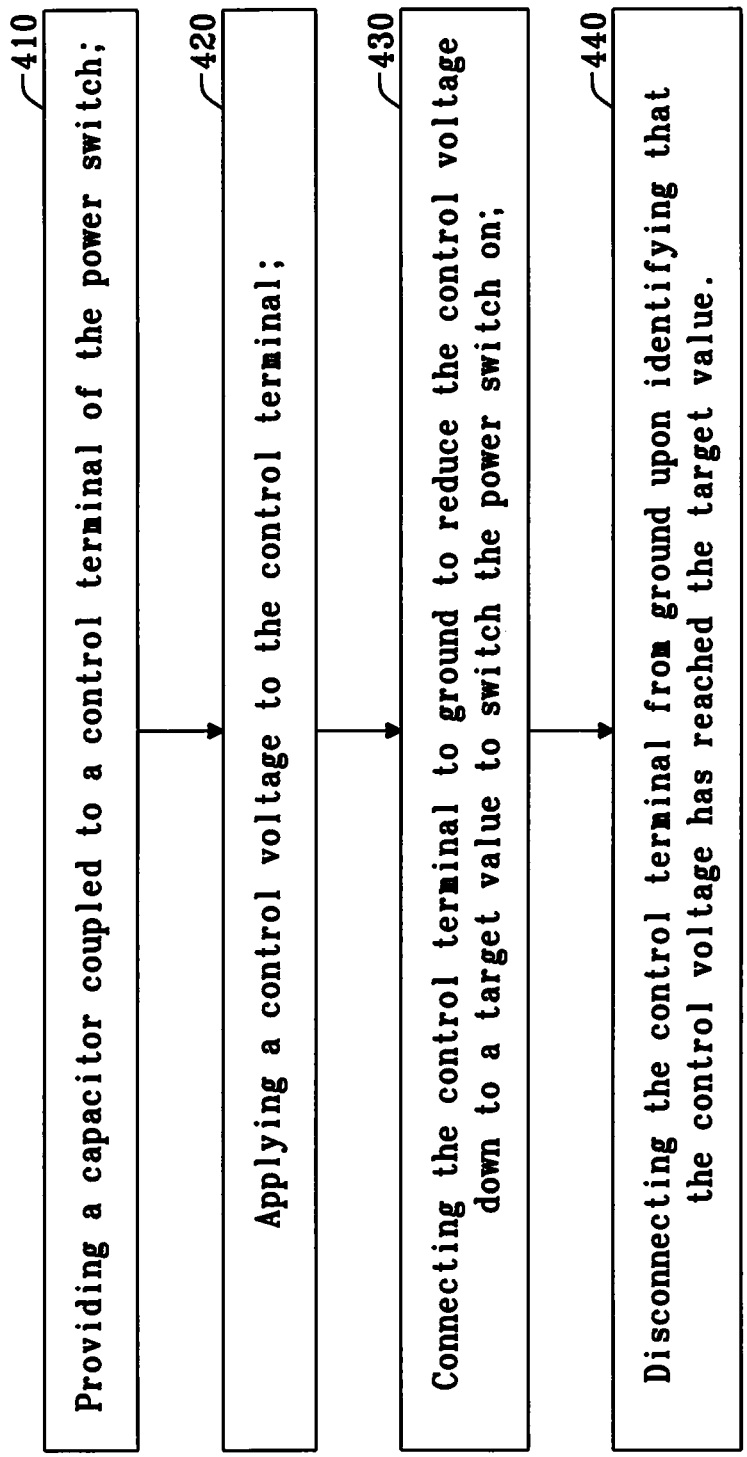
FIG. 4 is a flow chart of a method for driving a p-type power switch according to the disclosure.

FIG. 4 is a flow chart of a method for driving a p-type power switch according to the disclosure. At step 410, a capacitor coupled to a control terminal of the power switch is provided. For instance, the capacitor may be a flying capacitor. At step 420, a control voltage is applied to the control terminal of the power switch. At step 430, the control terminal is connected to ground to reduce the control voltage down to a target value to switch the power switch on. At step 440, the control terminal is disconnected from ground upon identifying that the control voltage has reached the target value.

Using this approach, it is possible to switch the p-type power switch ON relatively fast while preventing damaging the power switch. This is achieved by maintaining the control voltage applied to the control terminal of the power switch at a safe level. For instance, the voltage applied to a gate terminal of a pMOS may be the maximum allowed absolute gate-source voltage of the pMOS transistor.

Figure 5:
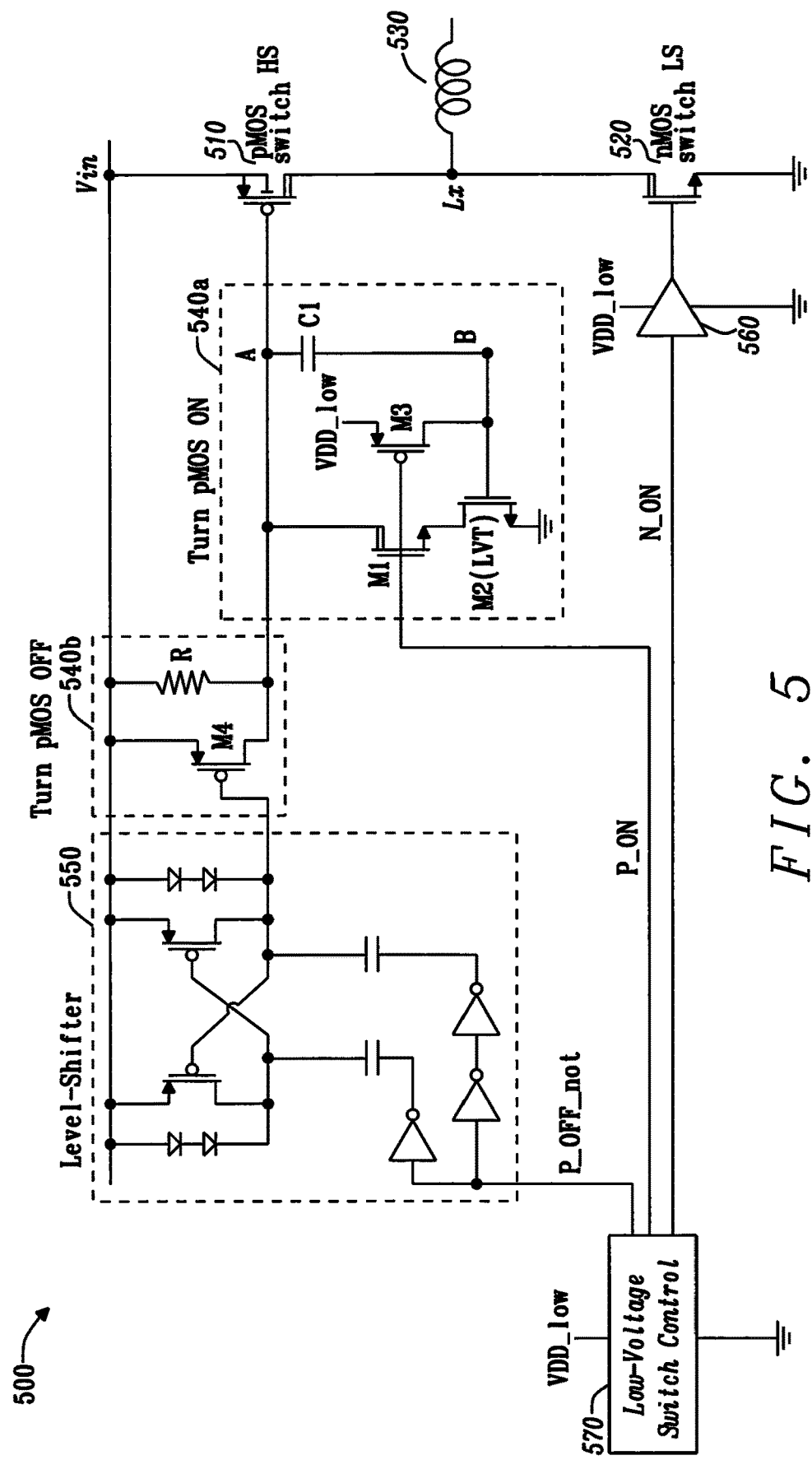
FIG. 5 is a switching power converter according to the disclosure.

FIG. 5 illustrates a switching power converter 500 according to the disclosure. The power converter 500 includes a high-side power switch HS 510 coupled to a low-side power switch LS 520 at a switching node Lx. The high-side power switch 510 is coupled to a high-side driver 540. The high side driver 540 is formed of a first circuit 540a for turning the high-side power switch on and a second circuit 540b for turning the high-side power switch off. The low-side power switch 520 is coupled to a low side driver 560. A controller 570 is provided to generate a plurality of logic signals. The controller 570 has an input for receiving a rail voltage VDD_low and three outputs for providing the logic signals P_OFF_not, P_ON and N_ON, respectively. The voltage VDD_low may be set to the maximum voltage that can be applied on the gate-source of the p-type power switch, and also the switches M1 an M2. The controller 570 is coupled to the high-side driver 540 via a level shifter 550. The controller 570 is also coupled to the low-side driver 560.

The high-side power switch 510 is a p-type power switch such as a pMOS transistor. The transistor 510 has a first terminal, for instance a source terminal for receiving an input voltage Vin, a second terminal, for instance a drain terminal coupled to the switching node Lx and a control terminal, for instance a gate terminal coupled to the first circuit 540a. The first circuit 540a includes three switches M1, M2 and M3 and a capacitor C1 also referred to as flying capacitor. The capacitor C1 has a first terminal coupled to the control terminal of power switch 510 at node A, and a second terminal coupled to node B. The node A is coupled to ground via the switches M1 and M2 forming a ground path.

In this example M1 and M2 are provided by n-type transistors such as nMOS transistors, while M3 is provided by a p-type transistor such as a pMOS transistor. The switch M1 has a drain terminal coupled to node A and a source terminal coupled to the drain terminal of M2. The switch M2 has a gate terminal coupled to node B and a source terminal coupled to ground. The switch M3 has a source terminal for receiving a rail voltage VDD_low, and drain terminal coupled to node B. The gate terminals of M1 and M3 are both coupled to the controller 170 to receive the logic signal P_ON.

The switch M2 may be chosen to have a low voltage threshold (LVT). For instance, the voltage threshold of M2 Vth(M2) may be chosen to be equal or near 0V. As will be explained later, this permits to set the Vgs (HS) directly to VDD_low.

The second circuit 540b includes a switch M4 in parallel with a resistance R. The switch M4 may be a p-type transistor such a pMOS. The switch M4 has a source terminal for receiving the input voltage Vin, a drain terminal coupled to the control terminal of the power switch 510 at node A, and a gate terminal for receiving the level shifted logic signal P_OFF_not, from the controller 570 via the level shifter 550.

The level-shifter 550 is designed to translate the signals from the voltage domain of the controller 570 to the voltage domain of the second circuit 540b. The level-shifter 550 may be implemented in different fashion. In this case the level shifter includes two transistors, two capacitors and three buffers.

In operation the high-side driver 540 is used to switch the high-side power switch 510 on and off repeatedly. The driver 540 is operable in a sequence of states comprising a first state to turn the power switch off and a second state to turn the power switch on. In the first state the control voltage of the power switch is set to the input voltage Vin and in the second state the control voltage of the power switch is set to a value defined by a difference between the input voltage Vin and the predetermined voltage VDD_low.

Figure 6:
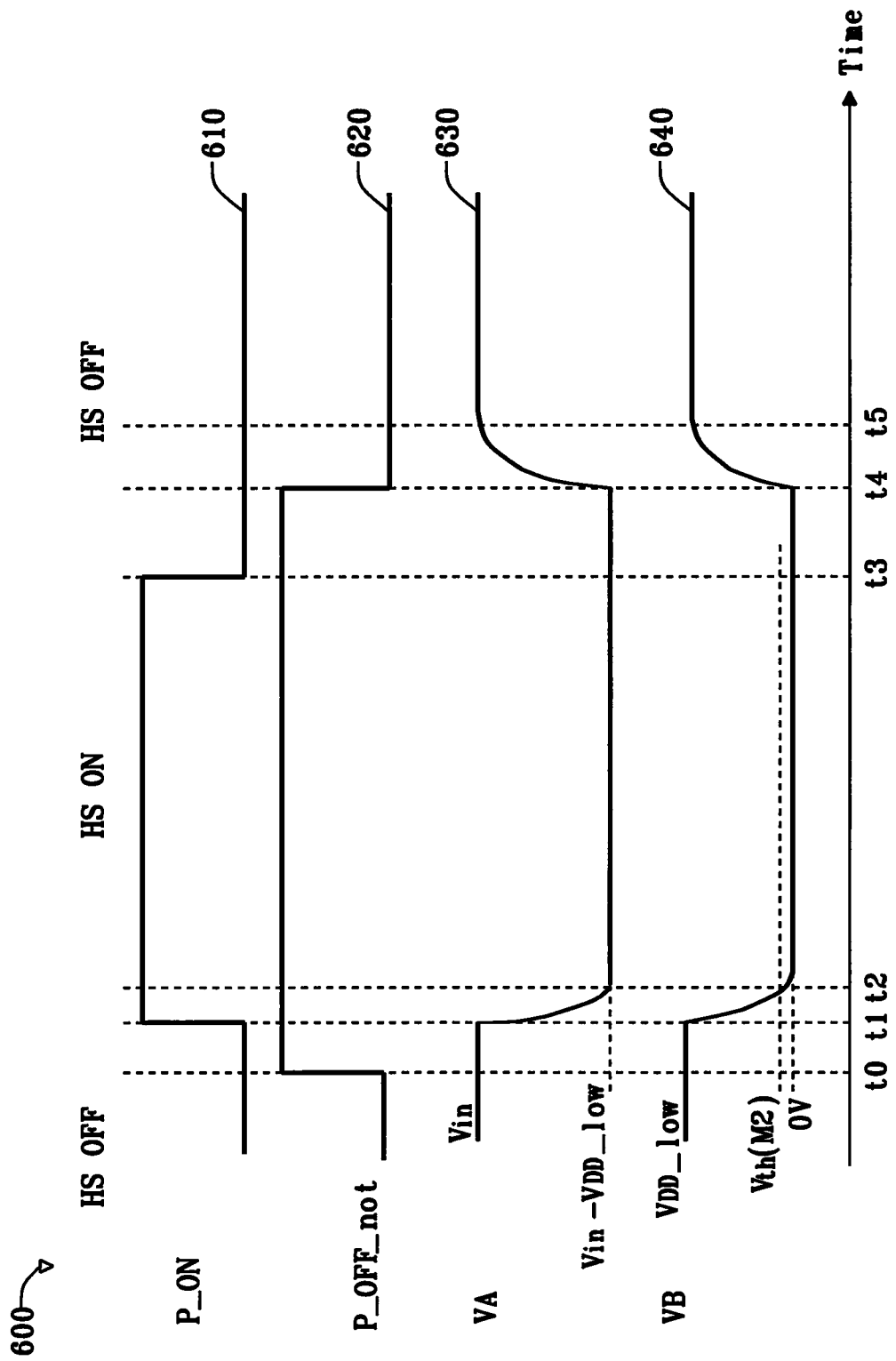
FIG. 6 is a plot illustrating the working of the circuit of FIG. 5.

FIG. 6 is a plot illustrating the working of the circuit of FIG. 5. The plot 600 shows the logic signals P_ON 610, P_OFF_not 620, and the voltages VA 630 at node A and VB 640 at node B, as a function of time. The operation can be split in four phases referred to as phase 1, phase 2, phase 3 and phase 4.

Before a time t0, the circuit is in phase 1, referred to as the initial phase. The logic signal P_OFF_not is low, for instance logic 0, hence turning M4 ON. The logic signal P_ON is low, for instance logic 0, hence turning M1 OFF and M3 ON. The voltage VA at node A is equal to Vin (Vg(HS)=VA=Vin), therefore Vgs(HS)=Vin−Vin=0, and the high-side power switch 510 is OFF. Since M3 is ON, the voltage VB at node B is equal to VDD_low (Vg(M2) =VDD_low). The voltage VDD_low is equal or greater than the threshold voltage of M2 VDD_low Vth(M2) so that M2 stays ON. As a result, the capacitor C1 is charged through M3 and M4 to a voltage equal to Vin−VDD_low.

At the time t0, the circuit enters phase 2, referred to as transition phase for turning the high-side power switch ON. At t0 the logic signal P_OFF_not goes from low to high hence turning M4 off. Then shortly after at time t1 the logic signal P_ON goes from low to high, for instance from logic 0 to logic 1 corresponding to the rising edge, hence turning M1 ON and M3 OFF. Since M1 and M2 are both ON, the voltage VA at node A starts decreasing. A current flows between the source and gate of the pMOS 510, hence charging its gate-source capacitance. The transistors M1 and M2 may be strong transistors to allow a relatively large current to pass through. As a result, the discharge at node A occurs at a fast rate. The voltage at node B also starts decreasing quickly through the capacitor C1. The node B has a parasitic capacitance due to M2 and the parasitic capacitance of C1. Consequently, the voltage at node B drops less than the voltage at node A. The capacitor C1 is therefore acting as a floating but constant voltage source.

At a time t2, VB reaches the threshold voltage of M2 Vth(M2), hence turning M2 OFF (open). As a result, the voltage at node A stops decreasing. The source to gate voltage of the high side power switch Vgs(HS)=Vin−(Vin− VDD_low)=VDD_low. The high-side power switch 510 is turned ON fully. The switch M2 is used to detect when the gate-source capacitance of the power switch is charged and the capacitor C1 is used to keep the gate-source capacitance of the power switch charged.

The ratio of the voltage variation at node A and node B between the times t1 and t2 can be expressed as:

$$\frac{VB(t1) - VB(t2)}{VA(t1) - VA(t2)} = \frac{C1}{C1 + C\text{parasitic}} \quad (1)$$

When neglecting the parasitic capacitance at node B and assuming that the threshold voltage of M2 is almost 0V, then Node B will stay at 0V and node A will stay at a value of Vin−VDD_low. In this situation, the high-side power switch has the maximum allowed absolute gate-source voltage. In practice the parasitic capacitance at node B (Cparasitic) is not null nor is the threshold voltage of M2 0 V. As a result, the end voltage of node A at time t2 can be expressed as:

$$VA(t2)=Vin+(Vth(M2)-VDD\_low)*(C1+Cparasitic)/C1 \quad (2)$$

By selecting a proper value for C1 with respect to the parasitic capacitance at node B, and the threshold voltage of M2, one can obtain an end voltage of node A which is very close to the ideal value of (Vin−VDD_low).

As mentioned above VDD_low may be conveniently chosen to be the maximum voltage that can be applied between the gate-source of an nMOS or between the source-gate of a pMOS transistor.

In a numerical example, Vin=4V, VDD_low=1.8V, Vth (M2)=0.3V, Vth(HS pMOS)=−0.7V, Cparasitic=10% of C1. The voltage VB(t1)=1.8V and VB(t2)=0.3V. Similarly the voltage VA(t1)=4V and using Eq.2, VA(t2)=4V−(1.8V −0.3V)*110%=2.35V. In this example VA(t2) is close to the ideal value of Vin−VDD_low=2.2 V.

The voltage at node A varies between Vin (HS pMOS=OFF) and Vin−1.8V (HS pMOS=ON). The voltage at node B varies between 1.8V (HS pMOS=OFF, M2=ON) and 0V (HS pMOS=ON, M2=OFF).

Between the times t2 and t3, the circuit is in phase 3, the high-side power switch remains turned ON fully. At the time t3, the circuit enters phase 4, referred to as the transition phase for turning the high-side power switch OFF. At time t3 the logic signal P_ON goes low, hence turning M1 OFF and M3 ON. Since M1 is turned OFF, the circuit 540a cannot pull the voltage at node A low.

At time t4 the logic signal P_OFF_not goes low. The signal P_OFF_not is level shifted and applied to the gate of M4 as shown in FIG. 5, hence turning M4 ON and pulling VA to Vin. Since M3 is ON, the voltage at node B starts rising towards VDD_low. The voltage at node B is pulled up mainly by the capacitor C1. The switch M3 is used to keep C1 equal to Vin-VDD_low even if Vin varies. At time t4 the voltage VA is equal to Vin and the high-side power switch is fully OFF. Since M3 is ON, the node B will be recharged to VDD_low, in case it was not exactly equal to VDD_low. When the voltage at node VB reach Vth(M2), the switch M2 turns ON.

In FIG. 6 there is a delay between the times t0 and t1 and between the times t3 and t4, respectively. It would also be possible to implement a circuit that is fast enough to perform the change of state of the logic signals P_ON and P_OFF_not at a same time.

The driver 540 permits a fast turn-on of the power switch 510 while keeping the gate-source voltage within safe values. This simple design does not consume static power and does not require a high-side ground, hence improving the efficiency of the circuit and reducing its footprint. The driver 540 also permits to drive the power switch at or close to the maximum Vgs value that the power transistor can withstand between the gate and source terminals. This reduces the on-resistance Ron of the power switch and the silicon area required. In addition, the topology of the converter of FIG. 5 consumes very little current when the converter is not switching.

Advantageously, the node B can be used to provide a signal indicating that the high-side power switch has turned OFF. When VB is equal to VDD_low, the high side power switch is fully OFF. This information can be used to adjust the timing for switching the low side power switch ON. For instance, this may be used to prevent the high-side power switch and the low side power switch from being turned ON at a same time.

Figure 7:
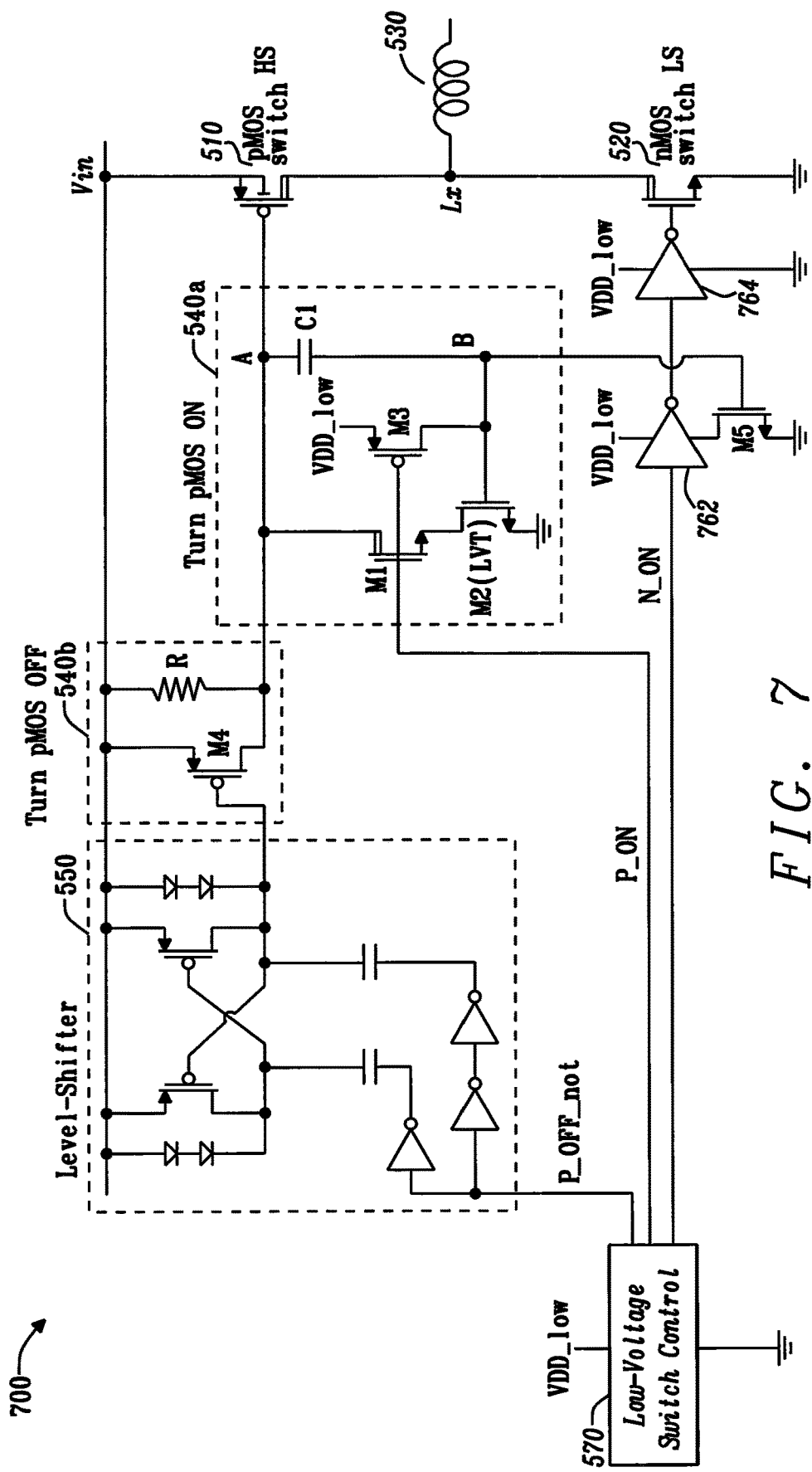
FIG. 7 is a modified version of the switching power converter of FIG. 5.

FIG. 7 shows a modified version of the switching power converter of FIG. 5. The circuit 700 shares many similar components to those illustrated in the circuit 500. The same reference numerals have been used to represent corresponding components and their description will not be repeated for sake of brevity. The low-side driver includes two NOT gates 762 and 764 coupled in series. The first NOT gate 762 has an input for receiving the N_ON signal from the controller 570 and an output coupled to the input of the second NOT gate 764. A switch M5 couples the first NOT gate to ground. In this example the switch M5 is an n-type transistor having a gate terminal coupled to node B of the first circuit 540*a*.

In operation when VB=VDD_low, the switch M5 is turned ON, hence enabling the NOT gate 762. The logic signal N_ON is applied to the gate of the low-side power switch 520 via the two NOT gates 762 and 764 in series. As a result, the power switch 520 turns ON. When VB is lower than VDD_low, indicating that the high-side power switch is ON, then the switch M5 is off, hence disabling the first NOT gate 762. Stated another way when M5 is OFF, the output of 762 can only be high since the connection to ground is not provided. Consequently, the high signal at the output of 762 is inverted by the NOT gate 764 and the low-side power switch 520 is turned OFF.

The driver for p-type power switch of the disclosure may be used in various switching power converters including buck, boost or buck-boost converters. It may also be used in other types of circuits such as in class-D audio amplifiers or some charge-pumps circuits.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

What is claimed is:

1. A driver for driving a p-type power switch, the driver comprising
   a capacitor coupled to a control terminal of the power switch;
   the driver being adapted
   to apply a control voltage to the control terminal, to connect the control terminal to ground to reduce the control voltage down to a target value to switch the power switch on;
   and to disconnect the control terminal from ground upon identifying that the control voltage has reached the target value;
   wherein the capacitor has a first terminal coupled to the control terminal and a second terminal reversibly coupled to a voltage source adapted to provide a predetermined voltage.

2. The driver as claimed in claim 1, wherein the control terminal is coupled to ground via a first switch and a second switch.

3. The driver as claimed in claim 2, wherein the the second terminal of the capacitor is reversibly coupled to the voltage source via a third switch.

4. The driver as claimed in claim 3, comprising a fourth switch having a first terminal adapted to receive an input voltage, and a second terminal coupled to the control terminal of the power switch.

5. The driver as claimed in claim 4, wherein the target value is defined by a difference between the input voltage and the predetermined voltage.

6. The driver as claimed in claim 4, the driver being operable in a sequence of states comprising a first state to turn the power switch off and a second state to turn the power switch on, wherein in the first state the control voltage is set to the input voltage and wherein in the second state the control voltage is set to a value defined by a difference between the input voltage and the predetermined voltage.

7. The driver as claimed in claim 6, wherein in the first state the first switch is off, the third switch is on and the fourth switch is on, and wherein in the second state the first switch is on, the third switch is off and the fourth switch off.

8. The driver as claimed in claim 4, comprising a controller adapted to generate a first logic signal configured to control the first switch and the third switch, and a second logic signal configured to control the fourth switch.

9. The driver as claimed in claim 2, wherein the second terminal of the capacitor is coupled to a control terminal of the second switch.

10. The driver as claimed in claim 1, wherein the predetermined voltage is set to a limit value of the power switch.

11. The driver as claimed in claim 1, wherein a voltage across the capacitor remains substantially constant.

12. A circuit comprising a p-type power switch coupled to a first driver, the first driver comprising a capacitor coupled to a control terminal of the power switch; the first driver being adapted to apply a control voltage to the control terminal, to connect the control terminal to ground to reduce the control voltage down to a target value to switch the power switch on; and to disconnect the control terminal from ground upon identifying that the control voltage has reached the target value: wherein the capacitor has a first terminal coupled to the control terminal and a second terminal reversibly coupled to a voltage source adapted to provide a predetermined voltage.

13. The circuit as claimed in claim 12, wherein the control terminal is coupled to ground via a first switch and a second switch, wherein the second terminal of the capacitor is reversibly coupled to the voltage source via a third switch.

14. The circuit as claimed in claim 13, wherein the circuit is a switching power converter.

15. The circuit as claimed in claim 14, comprising a n-type power switch coupled to a second driver.

16. The circuit as claimed in claim 15, wherein the second driver is adapted to receive a signal from the second terminal of the capacitor.

17. The circuit as claimed in claim 16, wherein the second driver comprises two NOT gates coupled in series and wherein the second driver is adapted to enable or disable one of the NOT gates using the signal from the second terminal of the capacitor.

18. A method for driving a p-type power switch, the method comprising
- providing a capacitor coupled to a control terminal of the power switch; wherein the capacitor has a first terminal coupled to the control terminal and a second terminal reversibly coupled to a voltage source adapted to provide a predetermined voltage;
- applying a control voltage to the control terminal,
- connecting the control terminal to ground to reduce the control voltage down to a target value to switch the power switch on; and
- disconnecting the control terminal from ground upon identifying that the control voltage has reached the target value.

* * * * *